United States Patent [19]

Bergevin et al.

[11] Patent Number: 5,368,654
[45] Date of Patent: Nov. 29, 1994

[54] PHOTOVOLTAIC SYSTEM USING REFLECTED SOLAR RAYS OF THE SURROUNDINGS AND METHOD THEREFOR, TO DISPOSE OF SNOW, FROST AND ICE

[76] Inventors: Benoit Bergevin, 10370 Grande-Allée, Montreal, Qc, Canada, H3L 2M3; Pierre Hosatte, 22 du Grand Ravin, Sainte-Julie, Qc, Canada, J0L 2S0; Normand Vallières, 1652 Lauzon, La Plaine, Qc, Canada, J0N 1B0

[21] Appl. No.: 91,047

[22] Filed: Jul. 14, 1993

[51] Int. Cl.$^5$ ............................. H01L 31/048
[52] U.S. Cl. ................... 136/251; 136/246; 136/248
[58] Field of Search ............... 136/246, 248, 251

[56] References Cited

U.S. PATENT DOCUMENTS 5,128,181  7/1992  Kunert ........................ 428/34

FOREIGN PATENT DOCUMENTS

| 889735A | 4/1982 | Belgium . | |
|---|---|---|---|
| 2814243A | 10/1979 | Germany . | |
| 2936764A | 3/1981 | Germany . | |
| 53-72487 | 6/1978 | Japan . | |
| 56-73478 | 6/1981 | Japan . | |
| 59-22369 | 2/1984 | Japan ............... | 136/251 |
| 59-22370 | 2/1984 | Japan ............... | 136/251 |
| 59-34669 | 2/1984 | Japan ............... | 136/246 |
| 59-34670 | 2/1984 | Japan ............... | 136/246 |
| 59-34671 | 2/1984 | Japan ............... | 136/251 |
| 59-41873 | 3/1984 | Japan ............... | 136/246 |
| 59-231877 | 12/1984 | Japan . | |
| 60-138980 | 7/1985 | Japan ............... | 136/246 |
| 60-235442 | 11/1985 | Japan . | |
| 61-99384 | 5/1986 | Japan ............... | 136/251 |
| 62-18074 | 1/1987 | Japan . | |
| 62-122181 | 6/1987 | Japan . | |
| 62-285477 | 12/1987 | Japan . | |
| 63-16681 | 1/1988 | Japan ............... | 136/246 |
| 1-178691 | 7/1989 | Japan ............... | 136/291 |

*Primary Examiner*—Aaron Weisstuch
*Attorney, Agent, or Firm*—Antoine H. Gauvin

[57] ABSTRACT

This invention relates to a photovoltaic system comprising a casing having mounted therein a plurality of solar cells. The casing has a front and opposite thereto, a rear. The front of the casing is provided with a light-transmitting panel for transmitting solar light to the solar cells. The rear is a double wall. A first wall is in contact with the back of the solar cells, and on its side away from the solar cells is of a dark-opaque color, i.e. a solar light absorbing surface. The second wall is a light-transmitting enclosure of the dark-opaque colored side of the first wall, but spaced therefrom so as to produce a greenhouse effect. A method to remove snow, frost, and ice over a photovoltaic system involves maintaining the light-transmitting panel at an angle with the horizontal, receiving reflected solar rays from the surroundings of the photovoltaic systems through the light-transmitting enclosure to the outer side of dark-opaque color to be absorbed by the outer side and converted into heat to be transmitted to, and thereby to raise the temperature of the light-transmitting panel. Simultaneously, the light-transmitting enclosure creates a greenhouse effect and thereby an additional temperature increment to further raise the temperature of the light-transmitting panel to melt or sublimate snow, frost, and ice present thereon.

20 Claims, 2 Drawing Sheets

PHOTOVOLTAIC SYSTEM USING REFLECTED SOLAR RAYS OF THE SURROUNDINGS AND METHOD THEREFOR, TO DISPOSE OF SNOW, FROST AND ICE

BACKGROUND OF THE INVENTION

1. Field of the Invention

This invention relates to a photovoltaic system using reflected solar rays of the surroundings to dispose of snow, frost, ice, and the like. This invention relates in particular to photovoltaic systems having means to efficiently use the reflected solar ray from the surroundings of the photovoltaic systems, whether direct or diffused, for snow, frost, and ice disposal and methods therefor.

2. Description of Related Art

At present the most sold and profitable photovoltaic systems for continental climates such as Canada, must be operative year around in sites far remote from civilization, roads, and electrical sources. For this reason, reliability in electricity supply derived from said photovoltaic systems is a must, coupled with a minimum maintenance requirement and absence of combustibles requirement.

The main cause for power failure of these photovoltaic systems is due to snow, frost, and ice covering up the cells. Indeed, even a partial obstruction suffices to create high energy losses. For instance, 2 cm of snow over photovoltaic systems decrease the energy output by 90%. A few millimeters suffice to reduce the output by half. Snow covering of the cells also has a cumulative effect, insofar as the non-removed snow induces accumulation of future snows and to that extent reduces the sun rays able to reach the photovoltaic cells and which might be used, for instance, to heat-up these photovoltaic systems.

At present, in order to avoid snow accumulation, the photovoltaic systems are placed at an angle which is high with respect to the horizontal; they are even vertically placed. This, however, diminishes the energy output without eliminating the snow being blown or the glazed frost and the hoar-frost laid by frosted fog, mist, and haze. In winter, from October to April, the energy loss due to a vertical positioning of the photovoltaic systems, instead of an inclination of 45° or 60°, is greater than 15%, mainly due to the fact that the system collects less diffused radiation of the cloudy mass. In summer, 30% to 40% of the solar radiation is not collected.

A search has revealed the following patents all aiming at overcoming this problem of snow and ice:

Masakatsu et al teach in JP 53-72487 dated Jun. 27, 1978, a solar cell unit that reduces the effect of the snow and ice, by providing a transparent panel having small friction resistance and thermal transfer rate in front of the solar cell module constituted with solar cells contained in a transparent material and a removably mounted black panel having a good thermal absorption at the back of the solar cells. Thus the sun rays are moving through the transparent panel to hit the cells and therebetween said cells, the black panel.

K. Haensel teaches in DE 2936764 filed Mar. 19, 1981, incorporating a heating foil controlled by a switch, to melt ice and snow.

F. Cuevas teaches in BE-889735 filed Nov. 16, 1981, a dual sided solar panel for incident and reflected light, having series connected photoelectric cells illuminated from both sides, for improved conversion efficiency.

G. Bicher and R. Pfeil teach in DE 2814243 filed Oct. 11, 1979, a temperature sensor on dark absorption surface metal pilate embedded in insulating material, for a multiple storage solar energy powered heating system. This sensor detects wind, rain, snow, and the like.

M. Kitanishi teaches in JP 62-285477 dated Dec. 11, 1987, a reflecting plate to increase efficiency in generating electricity.

Sasaya et al, teach in JP 62-18074 dated Jan. 27, 197, an auxiliary heat generating apparatus to facilitate snow removal.

Yagi et al, teach in JP 60-235442 dated Nov. 22, 1985, to reverse the direction of the electric current to thaw when necessary.

Y. Inoue teaches in JP 59-231877 dated Dec. 26, 1984, an electrically heated system comprising a transparent hollow glass.

Kanema et al, teach in JP 62-122181 dated Jun. 3, 1987, waterproofing of the peripheral part of a module.

Yabe et al, in JP 56-73478 dated Jun. 18, 1981, teach a special structure for a panel surface of solar cells.

None of the above patents taken alone or in combination, teach Applicant's invention.

SUMMARY OF THE INVENTION

The invention aims at optimizing the use of reflected solar rays from the surroundings of a photovoltaic system with the minimum structure requirement by providing a low-cost solar thermal collector.

Broadly stated, the invention is directed to a photovoltaic system comprising a casing having mounted therein a plurality of solar cells, said casing having a front and opposite thereto, a rear, and said solar cells having a receiving front side and opposite thereto a back side, said front of said casing being provided with a light-transmitting panel for transmitting solar light to said solar cells at the receiving front sides thereof, said light-transmitting panel having an outer surface, said rear of said casing being of a double wall construction, said double wall consisting of a first wall and a second wall, said first wall being in contact with the back of said solar cells, and said first wall on its side facing away from said solar cells being an opaque, dark-colored, solar-light-absorbing surface, said second wall being a light-transmitting enclosure of said dark-colored side of said first wall, but spaced therefrom as to produce a greenhouse effect and reduce heat-losses, whereby reflected solar rays from the surroundings of the photovoltaic system are received by said rear of said casing on said dark-colored side and said light-transmitting enclosure at said rear produces a greenhouse effect increasing the temperature of the cells and thereby of said light-transmitting panel of said front.

By "greenhouse effect", throughout the specification including the claims, is meant the effect of avoiding heat losses and particularly that which is due to ambient winds.

Preferably, said outer surface of said light-transmitting panel, has small friction resistance.

This photovoltaic system which may include one or several modules, makes a rational use of the reflected solar rays, where the albedos are higher in winter when snow is prevailing and heat is required, than in summer when vegetation prevails.

The invention is also directed to a method to remove snow, frost, and ice over a photovoltaic system having a light-transmitting panel for sending said light to solar cells and opposed thereto, a rear being of a double wall construction, said light-transmitting panel having an outer surface, said double wall consisting of a first wall and a second wall, said first wall being in contact with the back of said solar cells, to enable heat transfer and said first wall on its side away from said solar cells, being an opaque, dark-colored, solar-light-absorbing surface, said second wall being a light-transmitting enclosure of said dark-colored side of said first wall, but spaced therefrom so as to produce a greenhouse effect and reduce heat-losses, comprising:

maintaining said light-transmitting panel at an angle with the horizontal, receiving reflected solar rays from the surroundings of the photovoltaic system through said light-transmitting enclosure to said dark-colored side of said first wall to be absorbed by said side and converted into heat to be transmitted to, and to raise the temperature of said light-transmitting panel, and simultaneously said light-transmitting enclosure creating a greenhouse effect and thereby an additional temperature increment to further raise the temperature of said light-transmitting panel, thereby, when said light-transmitting panel of said front is at, or above, the melting temperature of water, said panel causing any snow, frost, and ice present on said panel to form a water film on which any remaining snow, frost, and ice slide down, and when said light-transmitting panel of said front is below the melting temperature of water, said panel which has a temperature higher than ambient temperature, causing accelerated sublimation of any snow, frost, and ice present in frozen form on said panel.

The invention is directed preferably to such photovoltaic systems wherein said dark surface is black.

The invention is also directed preferably to such a photovoltaic system which is an all-season photovoltaic system and wherein said first wall and said second wall of said rear are fixedly mounted, thus requiring no special season adjustments or changes.

Further embodiments of the invention will be described herein below.

BRIEF DESCRIPTION OF THE DRAWINGS

In the drawings which illustrate some of the preferred ways of carrying out the invention.

DESCRIPTION OF THE PREFERRED EMBODIMENTS OF THE INVENTION

Figure 1:
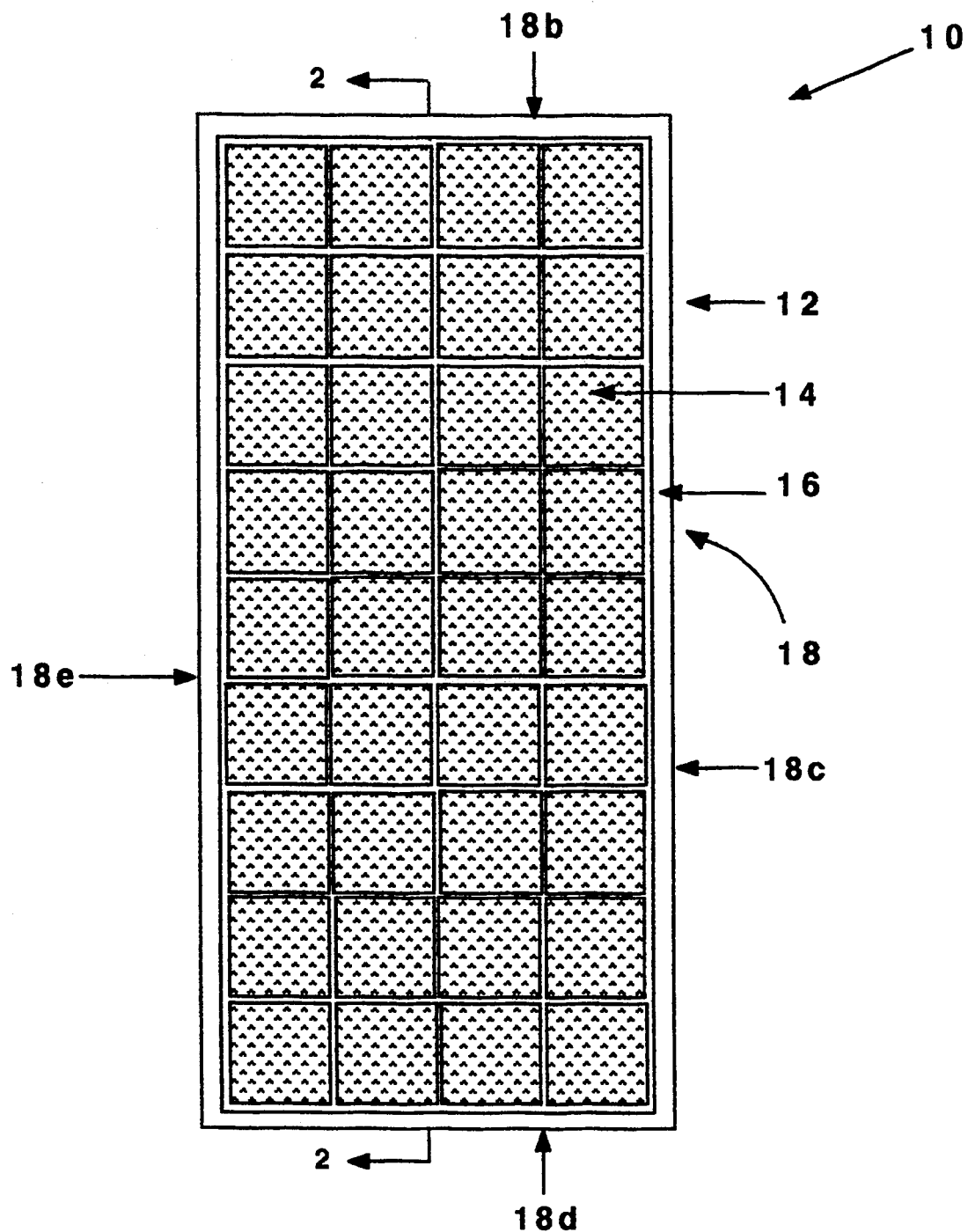
FIG. 1 is a front view of a photovoltaic system.

As shown in FIG. 1, a photovoltaic system 10 comprises a casing 12 having mounted therein a plurality of solar cells 14. The casing has a front 16 and opposite thereto, a rear 18 and unless the casing is parabola-shaped or has a triangularly shaped cross-section, sides 18b, 18c, 18d, 18e. These sides are preferably short so that the casing is preferably shallow.

The system 10 includes one or several casings 12, such as described above, only one being shown for sake of clarity.

The front of the casing is provided with a light-transmitting panel 20, (better shown in FIG. 2) generally sealed to a receiving front side of the solar cells 14, for transmitting solar light to the solar cells 14. Opposed to the receiving front side, the solar cells have a back side. Preferably, this panel 20, on its outer side 20a, has small friction resistance or coefficient of friction. The rear of the casing 18 is a double wall.

Figure 2:
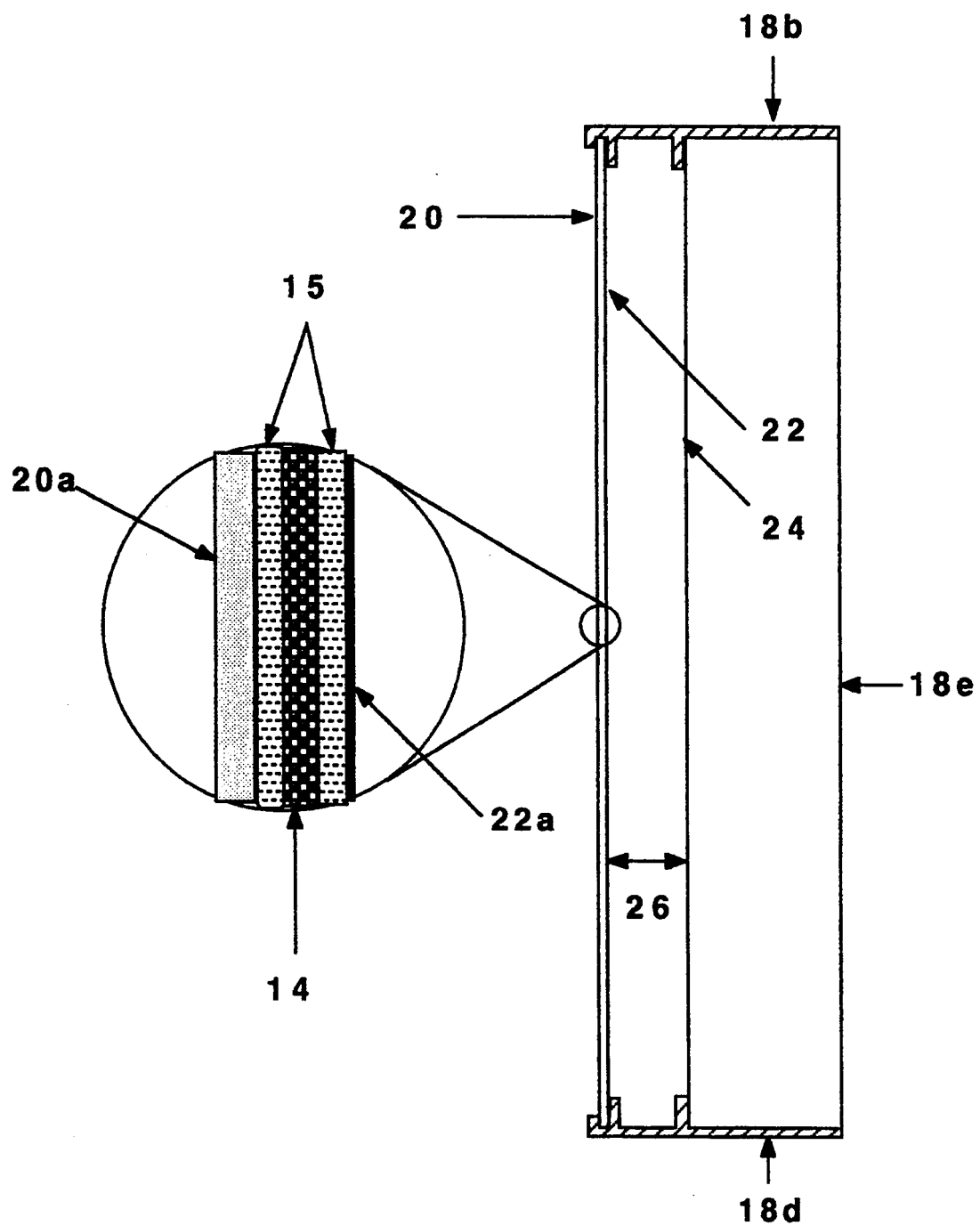
FIG. 2 is a view taken along line 2—2 of FIG. 1.

The double wall consists of a first wall 22 and a second wall 24, better shown in FIG. 2.

The first wall 22 defines, or preferably is in contact with, the back of the solar cells to enable heat transfer. This first wall on its side 22a away from said solar cells is of an opaque, dark-colored, solar-light-absorbing surface, preferably black.

The second wall 24 is a light-transmitting enclosure of said dark-colored side of said first wall 22, but spaced therefrom as to produce a greenhouse effect, whereby reflected solar rays from the surroundings of the photovoltaic system are received by said rear of said casing on said dark-colored side and said light-transmitting enclosure at said rear produces a greenhouse effect increasing the temperature of the cells and thereby of said light-transmitting panel of said front. The rear of the casing thus becomes a solar thermal collector at low cost.

This light-transmitting enclosure also reduces heat loss due to winds generally encountered around the photovoltaic system.

Preferably, the solar cells are mutually connected in a continuous plane with no spacing in between them, as shown in FIG. 1 for instance.

In a particular embodiment, the light-transmitting panel 20, for transmitting solar light to the solar cells 14 of the front casing, may be made of glass and is sealed to the solar cells 14 with a polymer, preferably EVA, (polyethylene-vinylacetate), fused between said panel and said cells, as is well known in the art. Preferably, the cells are encapsulated in a polymer 15, EVA for instance, and the light-transmitting panel 20 sealed to the receiving front of the solar cells. Other light-transmitting materials may be used, if desired, bearing in mind that a waterproof and humidity proof barrier are normally provided for a good and extended life-time durability of the cells and that the light-transmitting material is subject to ultra-violet radiations, temperature variations, and that on its outer side the partition has preferably small friction resistance, although snow accumulation is reduced even with high friction resistance.

The outer side 22a of the casing 18 is of an opaque, dark-colored, solar-light-absorbing surface such as a black painted or anodized metallic or polymeric surface. For instance, but without being limited thereto, a black anodized or oxidized metallic foil, a black painted metallic casing, a glued-on black metallic foil, such as those sold under the trade-mark: "Solar-L-foil TM", a self-adhesive black metallic foil or black paints, such as those sold under the trade-mark: "Black velvet TM" may be used. Other opaque, dark colors may be used, though less preferred.

If desired, a pigment inert to and mixed with, a substrate making the back of the cells, might be used though less preferred.

Preferably, said outer side of an opaque, dark-colored, solar-light-absorbing surface has a low infra-red emissivity.

The light-transmitting enclosure 24 mounted over the outer side of the rear, but spaced therefrom as shown at 26, may be a rigid or flexible plastic film resistant to ultra-violet light. For instance: a Lexan TM polymer, a trade mark for a polycarbonate; other polycarbonates; a Teflon TM polymer, a trade mark for a polyfluoropolymer; and a Tedlar TM polymer, a trade mark for a polyvinylfluoride may also be used. Other light-transmitting enclosures may be used, if desired, bearing in mind that the light-transmitting enclosures are subject to ultra-violet radiations, temperature variations, and wind.

The light-transmitting enclosure is preferably spaced from the outer side having an opaque, dark-color by a distance of 0.1 to 5 cm and more preferably from 0.5 to 2 cm.

During average sunning conditions, it has been found that the temperature of the photovoltaic systems provided with the outer side having an opaque, dark-colored surface and the light-transmitting enclosure is about 20° C. higher than that of conventional systems. This elevation in temperature increases the temperature of the cells and thereby, when said light-transmitting panel of said front for transmitting solar light to said solar cells is at or above the melting temperature of water, said panel causing any snow, frost, and ice present on said panel to form a water film on which any remaining snow, frost, and ice slide down, and when said light-transmitting panel of said front is below the melting temperature of water, said panel which has a temperature higher than ambient temperature, causing accelerated sublimation of any snow, frost, and ice present in frozen form on said panel.

The performances are even more interesting when one considers that the accumulated snow in front of the light-transmitting panel of said front for transmitting solar light, is a thermal insulation between the heated surface of the light-transmitting panel and ambient air. This enables a quicker raising of the temperature of the light-transmitting panel.

In a particular embodiment, the solar cells are operating under constant voltage and the dimensions of the photovoltaic systems are set for the fall season and are thereby oversized for summer months.

This method to remove snow is more reliable than any of the known active methods, for instance electrically heated defrosters, in addition to the fact that no energy consumption is required.

In general, the light-transmitting panel is at an angle with the horizontal and preferably said angle with the horizon is the angle of the latitude at which said system is operating plus 15°.

It should be borne in mind that this system may be originally provided, or by providing the walls 22, 24 as described above, it may be added to a new module in the factory or retrofitted on installed conventional photovoltaic systems.

EXAMPLE

Two identical systems, each having a module, were used to carry out this observation, in a region having 45° latitude, except that one, (Sample A) was a conventional module having only a first wall, such as 22, white, while the other (Example 1) was a module having a double wall, with a wall, such as 22, being black. After a snow fall of 2 cm, within 3 hours of bright sunshine the next sunny day at an ambient temperature of $-15°$ C. in Example 1, the snow melted and cleared out over the light-transmitting panel. After two days, the snow had only partially left the light-transmitting panel of Sample A. In Example 1, the temperature of the module had risen above 0° C., while in Sample A, the measured temperature was about $-5°$ C.

While some of the preferred embodiments have been described herein above, it is to be understood that the invention is not to be construed as limited to these preferred embodiments, as many modifications and variations are possible within the spirit and scope of the appended claims.

I claim:

1. An outdoor snow removing photovoltaic system comprising a casing having mounted therein a plurality of solar cells, said casing having a front and opposite thereto, a rear, and said solar cells having a light receiving front side and opposite thereto, a back side, said front of said casing being provided with a light-transmitting panel for transmitting solar light to said solar cells at the light receiving front sides thereof, said light-transmitting panel having an outer surface, said light-transmitting surface being susceptible to receiving a member selected from the group consisting of snow, frost and ice, inhibiting solar light transmission to said solar cells, said rear of said casing being a double wall, said double wall consisting of a first wall and a second wall, said first wall being in contact with the back side of said solar cells to enable heat transfer, and said first wall on its side facing away from said solar cells being an opaque, dark-colored, solar-light-absorbing light-absorbing surface generating heat, said second wall being a light-transmitting enclosure of said dark-colored side of said first wall, but spaced therefrom as to produce a greenhouse effect and reduce heat-losses of the solar-light-absorbing surface, whereby reflected solar rays are received by said rear of said casing on said opaque dark-colored side and said light-transmitting enclosure at said rear produces a greenhouse effect increasing the temperature of the cells and thereby of said light-transmitting panel of said front and thereby easing melting of said member selected from the group consisting of snow, frost and ice when present on said light-transmitting surface.

2. The photovoltaic system as defined in claim 1, wherein said dark-colored surface is a black surface.

3. The photovoltaic system as defined in claim 1, which is an all-season photovoltaic system and wherein said first wall and said second wall of said rear are fixedly mounted.

4. The photovoltaic system as defined in claim 1, wherein said solar cells are mutually connected in a continuous plane with no spacing in between them.

5. The photovoltaic system as defined in claim 1, wherein said first wall on the dark-opaque coloured side, has a low infra-red emissivity.

6. The photovoltaic system as defined in claim 1, wherein said second wall is spaced from the dark-opaque coloured side of said first wall by a distance ranging from 0.1 to 5 cm.

7. The photovoltaic system as defined in claim 1, wherein said second wall is spaced from the dark-opaque coloured side of said first wall by a distance ranging from 0.5 to 2 cm.

8. The photovoltaic system as defined in claim 1, wherein said casing is shallow.

9. The photovoltaic system as defined in claim 1, wherein said light-transmitting panel is adapted to be at an angle with the horizontal.

10. The photovoltaic system as defined in claim 9, wherein said angle is the angle of the latitude at which said system is mounted plus 15°.

11. The photovoltaic system as defined in claim 1, wherein said light-transmitting enclosure is a polycarbonate.

12. The photovoltaic system as defined in claim 1, wherein said light-transmitting enclosure is a polyfluoropolymer.

13. The photovoltaic system as defined in claim 1, wherein said light-transmitting enclosure is a polyvinyl fluoride.

14. The photovoltaic system as defined in claim 1, wherein said light-transmitting panel is glass.

15. The photovoltaic system as defined in claim 1, wherein said outer surface of said light transmitting panel has small friction resistance.

16. The photovoltaic system as defined in claim 1, wherein said dark opaque color is provided by black metallic foils.

17. The photovoltaic system as defined in claim 1, wherein said dark opaque color is provided by a black paint.

18. A method to remove snow, frost and ice over an outdoor photovoltaic system having a front light-transmitting panel for sending said light to solar cells and opposed thereto, a rear being of a double wall construction, said double wall consisting of a first wall and a second wall, said first wall being in contact with the back of said solar cells to enable heat transfer, and said first wall on its side facing away from said solar cells being of a dark-opaque colour, solar-light-absorbing surface generating heat, said second wall being a light-transmitting enclosure of said dark-opaque coloured side of said first wall, but spaced therefrom so as to produce a greenhouse effect, comprising:

maintaining said light-transmitting panel at an angle with the horizontal, receiving reflected solar rays from the surroundings of the photovoltaic systems through said light-transmitting enclosure to said dark-opaque coloured side of said first wall to be absorbed by said side and converted into heat to be transmitted to, and to raise the temperature of said light-transmitting panel, and simultaneously said light-transmitting enclosure creating a greenhouse effect and thereby an additional temperature increment to further raise the temperature of said light-transmitting panel, thereby, when said light-transmitting panel of said front is at, or above, the melting temperature of water, said panel causing any snow, frost, and ice present on said panel to form a water film on which any remaining snow, frost, and ice slide down, and when said light-transmitting panel of said front is below the melting temperature of water, said panel which has a temperature higher than ambient temperature, causing accelerated sublimation of any snow, frost, and ice present in frozen form on said panel.

19. The method as defined in claim 18, wherein said dark color is black.

20. The method to remove snow and frost over a photovoltaic system as defined in claim 18, wherein said angle with the horizontal is the angle of the latitude at which said system is operating plus 15°.

* * * * *